United States Patent [19]
Merritt

[11] Patent Number: 5,986,488
[45] Date of Patent: Nov. 16, 1999

[54] METHOD AND APPARATUS FOR FAST RESET OF A ONE-SHOT CIRCUIT

[75] Inventor: Todd A. Merritt, Boise, Id.

[73] Assignee: Micron Technology, Inc., Boise, Id.

[21] Appl. No.: 08/954,933

[22] Filed: Oct. 21, 1997

[51] Int. Cl.$^6$ .................................................. H03K 5/01
[52] U.S. Cl. .......................................... 327/166; 327/227
[58] Field of Search .................................... 327/165, 166, 327/172, 176, 227, 228, 229, 230, 263, 264, 268, 291, 299

[56] References Cited

U.S. PATENT DOCUMENTS

| | | | |
|---|---|---|---|
| 3,601,636 | 8/1971 | Marsh, Jr. ................................ | 307/273 |
| 3,904,894 | 9/1975 | Ciolli ...................................... | 307/260 |
| 4,994,687 | 2/1991 | Fujii et al. .............................. | 307/291 |
| 5,729,169 | 3/1998 | Roohparvar ............................ | 327/277 |

*Primary Examiner*—Jeffrey Zweizig
*Attorney, Agent, or Firm*—Seed and Berry LLP

[57] ABSTRACT

A one-shot circuit comprises a pulse generation circuit having an external clock terminal adapted to receive an external clock signal, a reset terminal coupled to receive a reset signal, and an internal clock terminal on which the pulse generation circuit develops an internal clock signal. The pulse generation circuit operates in a first mode to drive the internal clock signal from a first level to a second level in response to a transition of the external clock signal from a first level to a second level. The pulse generation circuit operates in a second mode to drive the internal clock signal from the second level to the first level in response to the reset signal going active. A delay circuit has input and output terminals coupled to the internal clock terminal and reset terminal, respectively, of the pulse generation circuit. The delay circuit operates to drive the reset signal active a delay time after the pulse generation circuit drives the internal clock signal from the first level to the second level. The delay circuit further operates, while maintaining the reset signal active, to precharge in response to the reset signal going active.

30 Claims, 6 Drawing Sheets

METHOD AND APPARATUS FOR FAST RESET OF A ONE-SHOT CIRCUIT

TECHNICAL FIELD

The present invention relates generally to a one-shot circuit, and more specifically to a one-shot circuit having a fast reset usable for developing high-frequency clock signals.

BACKGROUND OF THE INVENTION

In synchronous system memories, an external clock signal drives individual synchronous memory devices in the system, and the synchronous memory devices perform specific data transfer operations, typically in response to the rising edges of the external clock signal. For example, in a typical synchronous dynamic random access memory ("SDRAM") a processor or some other external circuit applies address, data and transfer command information to one of the SDRAMs. The SDRAM latches the address and command information on a particular rising edge of the external clock signal, and the processor knows that a predetermined number of clock cycles later data may be read from the addressed SDRAM. During such data transfers, a clock buffer circuit in the SDRAM develops an internal clock signal in response to the external clock signal, and the various components within the SDRAM are controlled in response to the internal clock signal. The clock buffer circuit typically includes a one-shot circuit which operates to develop the internal clock signal in response to the external clock signal. In modern system memories, the frequency of the external clock signal is ever increasing to enable data transfer to and from the SDRAMs at correspondingly faster rates. As the external clock frequency increases, operation of the one-shot circuit becomes more critical due to the corresponding frequency increase of the internal clock signal that must be developed by the one-shot circuit.

FIG. 1 illustrates a conventional clock buffer circuit 10 including an input buffer circuit 12 receiving an external clock signal XCLK supplied by an external circuit (not shown in FIG. 1). The buffer circuit 12 inverts the external clock signal XCLK and develops an inverted clock signal $\overline{XCLK}$ on an output. The clock buffer circuit 10 further includes a one-shot circuit 38 receiving the inverted external clock signal $\overline{XCLK}$, and developing a pair of complementary internal clock signals CLKIN and $\overline{CLKIN}$ in response to the clock signal $\overline{XCLK}$. The one-shot circuit 38 includes a pair of cross-coupled NAND gates 40 and 42 connected as shown to form an RS flip-flop 44, as known in the art. A NAND gate 46 provides on its output a reset pulse in response to a high signal at the output of the NAND gate 40, and a high output from a delay circuit 48. The delay circuit 48 develops a high output a predetermined time after the clock signal CLKIN goes high. The reset pulse signal on the output of the NAND gate 46 is coupled to one input of the NAND gate 42, and operates to reset the RS flip-flop 44, as will be described in more detail below. Although the one-shot circuit 38 is shown as directly developing the internal clock signals CLKIN and $\overline{CLKIN}$, one skilled in the art will appreciate a conventional driver circuit (not shown in FIG. 1) may be coupled to the outputs of the RS flip-flop 44. Such a conventional driver circuit develops the internal clock signals CLKIN and $\overline{CLKIN}$ in response to the outputs from the flip-flop 44, and may be utilized to ensure such internal clock signals have very sharp rising and falling edges.

The delay circuit 48 includes two positive-edge delay circuits 50 and 52 connected in series as shown, each operable to delay for a delay time $t_d$ a rising edge on their inputs, and to pass without such a delay a falling edge on their inputs. FIG. 2 is a more detailed schematic of the positive-edge delay circuits 50 and 52 comprising the delay circuit 48. The positive-edge delay circuit 50 includes a NAND gate 54 having inputs receiving the signal CLKIN and the supply voltage $V_{CC}$, respectively, and an output coupled to a node D1'. The NAND gate 54 is typically formed of NMOS and PMOS transistors (not shown) which are sized such that the transistors driving the output high are relatively large while the transistors driving the output low are relatively small, thereby causing the NAND gate 54 to drive the node D1' high relatively quickly and low more slowly. A capacitor 56 is coupled between the node D1' and ground, and has a value selected to define the delay time $t_d$ of the positive-edge delay circuit 50. An inverter 58 drives the output D1 high when the voltage on node D1' drops below a low threshold voltage, and drives the output D1 low when the voltage on node D1' exceeds a high threshold voltage. The positive-edge delay circuit 52 includes a NAND gate 60, a capacitor 62, an inverter 64, an internal node D2' and an output D2 coupled as shown, and each of which operates in the same manner as previously described for the positive-edge delay circuit 50.

This series connection of the positive-edge delay circuits 50 and 52 results in the delay times $t_d$ of the two circuits being summed together with the output D2 going high two predetermined time delays $t_d$ after the signal CLKIN goes high. Although the delay times $t_d$ of the positive-edge circuits 50 and 52 are described as being equal, one skilled in the art will realize that in other embodiments the delay times $t_d$ may be different.

The operation of the clock buffer circuit 10 will now be described in more detail with reference to the timing diagram of FIG. 3. It should be noted that the signal $\overline{CLKIN}$ is not shown in the timing diagram of FIG. 3, but one skilled in the art will understand that this signal is merely the complement of the signal CLKIN. The clock buffer circuit 10 may be viewed as operating in one of three modes. In a first mode, designated a positive-edge mode, the clock buffer circuit 10 drives the internal clock signals CLKIN and $\overline{CLKIN}$ high and low, respectively, in response to a rising edge of the external clock signal XCLK. In a delay mode, the clock buffer circuit 10 times a delay time. After expiration of the delay time, the clock buffer circuit 10 commences the third mode of operation, designated the reset and precharge mode. During the reset and precharge mode, the clock buffer circuit 10 drives the clock signals CLKIN and $\overline{CLKIN}$ low and high, respectively, and precharges the circuits 50 and 52 in anticipation of the next rising edge of the external clock signal XCLK. Each of these modes will be described in more detail with reference to the timing diagram of FIG. 3.

Before a time $t_0$, the signals XCLK, D1, D2, and CLKIN are low, while the signals on nodes D1', D2', and the output of the NAND gate 46 are high. At the time $t_0$, the external clock signal XCLK goes high and the clock buffer circuit 10 operates in the positive-edge mode. In response to the external clock signal XCLK going high, the buffer 12 drives the inverted clock signal $\overline{XCLK}$ low. When the signal $\overline{XCLK}$ goes low, the NAND gate 40 drives the internal clock signal CLKIN high at a time $t_1$.

When the internal clock signal CLKIN goes high, the delay mode of operation commences. In the delay mode, the positive-edge delay circuit 50 begins timing the delay time $t_d$ in response to the signal CLKIN going high. In other words, when the signal CLKIN goes high, the NAND gate 54 drives its output low which starts discharging the capacitor 56 as indicated by the decay of the voltage on the node D1' at the time $t_1$. At about a time $t_2$, the inverter 58 drives the output D1 high in response to the voltage on node D1' dropping below the low threshold voltage of the inverter. As indicated in the timing diagram, the output D1 goes high the delay time $t_d$ after the signal CLKIN goes high. When the output D1 goes high at time $t_2$, both inputs of the NAND gate 60 of the positive-edge delay circuit 52 are high, causing the NAND gate 60 to drive its output low which begins discharging the capacitor 62 as indicated by the decay of the voltage on node D2'. The output D2 of the positive-edge delay circuit 52 remains low until the voltage on the node D2' is discharged below the low threshold voltage of the inverter 64. At a time $t_3$, the inverter 64 drives the output D2 high in response to the voltage on node D2' dropping below the low threshold voltage of the inverter. Note that just before the time $t_3$, the external clock signal XCLK goes low causing the buffer circuit 12 to drive the signal $\overline{\text{XCLK}}$ high. At this point, even though the signal $\overline{\text{XCLK}}$ goes high, the output of the NAND gate 40 continues driving the signal CLKIN high because the output of the NAND gate 42 remains low.

When the output D2 goes high at time $t_3$, the reset and precharge mode of operation commences. In response to the output D2 going high, the NAND gate 46 drives its output low since both its inputs, D2 and CLKIN, are high. The output of the NAND gate 46 functions as a reset signal for the RS-flip-flop 44, and when its output goes low the internal clock signals CLKIN and $\overline{\text{CLKIN}}$ are reset low and high, respectively, in anticipation of the next rising edge of the external clock signal XCLK. More specifically, at the time $t_4$, the low output from the NAND gate 46 causes the NAND gate 42 to drive its output high. In response to the output of the NAND gate 42 going high, the NAND gate 40, which now has two high inputs, drives the signal CLKIN low at time $t_4$. In this way, the output of the NAND gate 46 operates as a reset pulse to drive the signals CLKIN and $\overline{\text{CLKIN}}$ low and high, respectively.

When the signal CLKIN goes low at time $t_4$, the precharging portion of the reset and precharge mode begins. During the precharge portion, the output of the NAND gate 46 goes high just after the time $t_4$ in response to the signal CLKIN going low. In addition, the low signal CLKIN causes the positive-edge delay circuits 50 and 52 to begin precharging their respective internal nodes D1' and D2' as indicated by the increasing voltages on these nodes just after the time $t_4$. A short time after the time $t_4$, the inverter 64 drives the output D2 low in response to the voltage on node D2' exceeding the high threshold voltage of the inverter 64. At approximately the same time, the inverter 58 drives the output D1 low in response to the voltage on node D1' exceeding the high threshold voltage of the inverter 58.

After the time $t_4$, the voltages on nodes D1' and D2' continue to increase as these nodes precharge. A precharge time is defined for the positive-edge delay circuits 50 and 52 as the time between when the respective internal nodes D1' and D2' begin precharging to when the nodes begin discharging. Accordingly, a precharge time $t_{p50}$ of the positive-edge delay circuit 50 is from the time $t_4$ to a time $t_5$, and a precharge time $t_{p52}$ of the positive-edge delay circuit 52 is from the time $t_4$ to a time $t_6$. The precharge time $t_{p52}$ is longer than the precharge time $t_{p50}$ so the positive-edge delay circuit 52 has longer to precharge the internal node D2' than the positive-edge delay circuit 50 has to precharge the internal node D1'. The positive-edge delay circuit 52 is able to fully precharge the node D2' due in part to the longer precharge time $t_{p52}$, and in part because the node D2' was not discharged as close to ground when precharging began at time $t_4$.

At the time $t_5$, a second cycle of the external clock signal XCLK is marked by the signal XCLK going high, and the clock buffer circuit 10 once again begins operation in the positive-edge mode. As previously described, when the signal XCLK goes high the signal CLKIN goes high a short time later, causing the delay circuit 50 to begin discharging the node D1' during operation in the delay mode. From the timing diagram, it is seen that at the time $t_5$ the voltage on node D1' has not yet been fully precharged to the supply voltage $V_{CC}$. As a result, when the capacitor 56 starts discharging at just after time $t_5$, the voltage on the node D1' reaches the low threshold voltage of the inverter 58 faster than it did in the previous cycle. This is true because the voltage on node D1' must be discharged from a lesser voltage than in the previous cycle at just after the time $t_0$. At a time $t_6$, the output D1 goes high upon the voltage on node D1' reaching the low threshold voltage of the inverter 58. The delay time of the positive-edge delay circuit 50 during this cycle is given by the time interval from just after time $t_5$ to time $t_6$, and is designated $t'_d$. The delay time $t'_d$ is seen to be shorter than the delay time $t_d$ during the last cycle. Thus, the output D1 goes high sooner than is desired due to the delay circuit 50 not having been fully precharged before the positive-edge of the signal XCLK at time $t_5$. In response to the output D1 going high at time $t_6$, the clock buffer circuit 10 operates as previously described with the output D2 going high at a time $t_7$ and the signal CLKIN going low a short time later at a time $t_8$.

The shorter delay time $t'_d$ of the positive-edge delay circuit 50 manifests itself as a variation in the pulse width of the internal clock signals CLKIN and $\overline{\text{CLKIN}}$. The internal clock signal CLKIN has a shorter pulse width $t'_w$ for its second pulse between times $t_5$ and $t_8$ than its initial pulse width $t_w$ between times $t_1$ and $t_4$. The shorter pulse width $t'_w$ of the second pulse is due to the shorter delay time $t'_d$ of the positive-edge delay circuit 50 caused by the node D1' not having time to fully precharge to its desired level. As shown in the signal timing diagram, a third pulse of the internal clock signal CLKIN may have yet a different pulse width $t''_w$ due to the varying precharge voltage on node D1'. Thus, the pulse width of the internal clock signal CLKIN varies undesirably during operation of the clock buffer circuit 10 due to the variations in the delay time of the positive-edge delay circuit 50 caused by the inability to precharge the internal node D1' during the precharge time $t_{p50}$ available at the operating frequency of the external clock signal XCLK. As the frequency of the external clock signal XCLK increases, the precharge time $t_{p50}$ available to fully precharge the internal node D1' decreases, and variations in the pulse width of the signal CLKIN from cycle to cycle become more significant. Although the positive-edge delay circuit 52 is described as fully precharging the internal node D2', similar problems may result for the circuit 52 as the frequency of the external clock signal XCLK increases and the precharge time $t_{p52}$ accordingly decreases.

There is a need for a one-shot circuit having a delay circuit capable of a fast precharge to thereby enable the one-shot circuit to develop an internal clock signal having a constant pulse width in response to a high frequency external clock signal.

SUMMARY OF THE INVENTION

A one-shot circuit comprises a pulse generation circuit having an external clock terminal adapted to receive an external clock signal, a reset terminal coupled to receive a reset signal, and an internal clock terminal on which the pulse generation circuit develops an internal clock signal. The pulse generation circuit operates in a first mode to drive the internal clock signal from a first level to a second level in response to a transition of the external clock signal from a first level to a second level. The pulse generation circuit operates in a second mode to drive the internal clock signal from the second level to the first level in response to the reset signal going active. A delay circuit has input and output terminals coupled to the internal clock terminal and reset terminal, respectively, of the pulse generation circuit. The delay circuit operates to drive the reset signal active a delay time after the pulse generation circuit drives the internal clock signal from the first level to the second level. The delay circuit further operates, while maintaining the reset signal active, to precharge in response to the reset signal going active.

In one embodiment, the one-shot circuit is utilized in combination with a buffer circuit and a driver circuit to form a clock buffer circuit operable to develop a complementary pair of internal clock signals in response to a high frequency external clock signal.

DETAILED DESCRIPTION OF THE INVENTION

Figure 1:
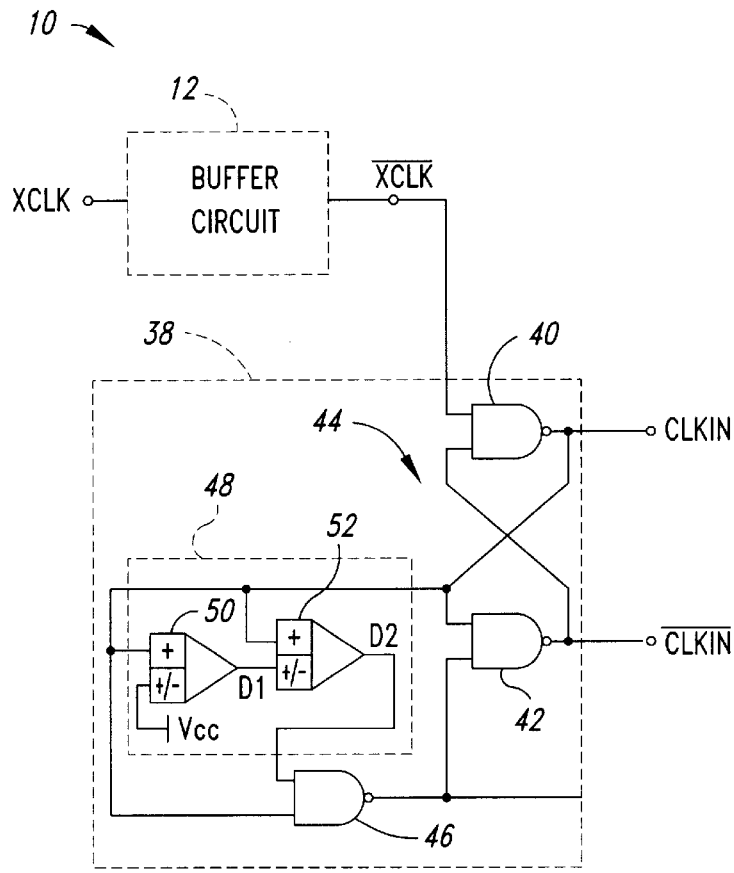
FIG. 1 is a schematic of a conventional clock buffer circuit including a one-shot circuit having a conventional time delay circuit.
Figure 4:
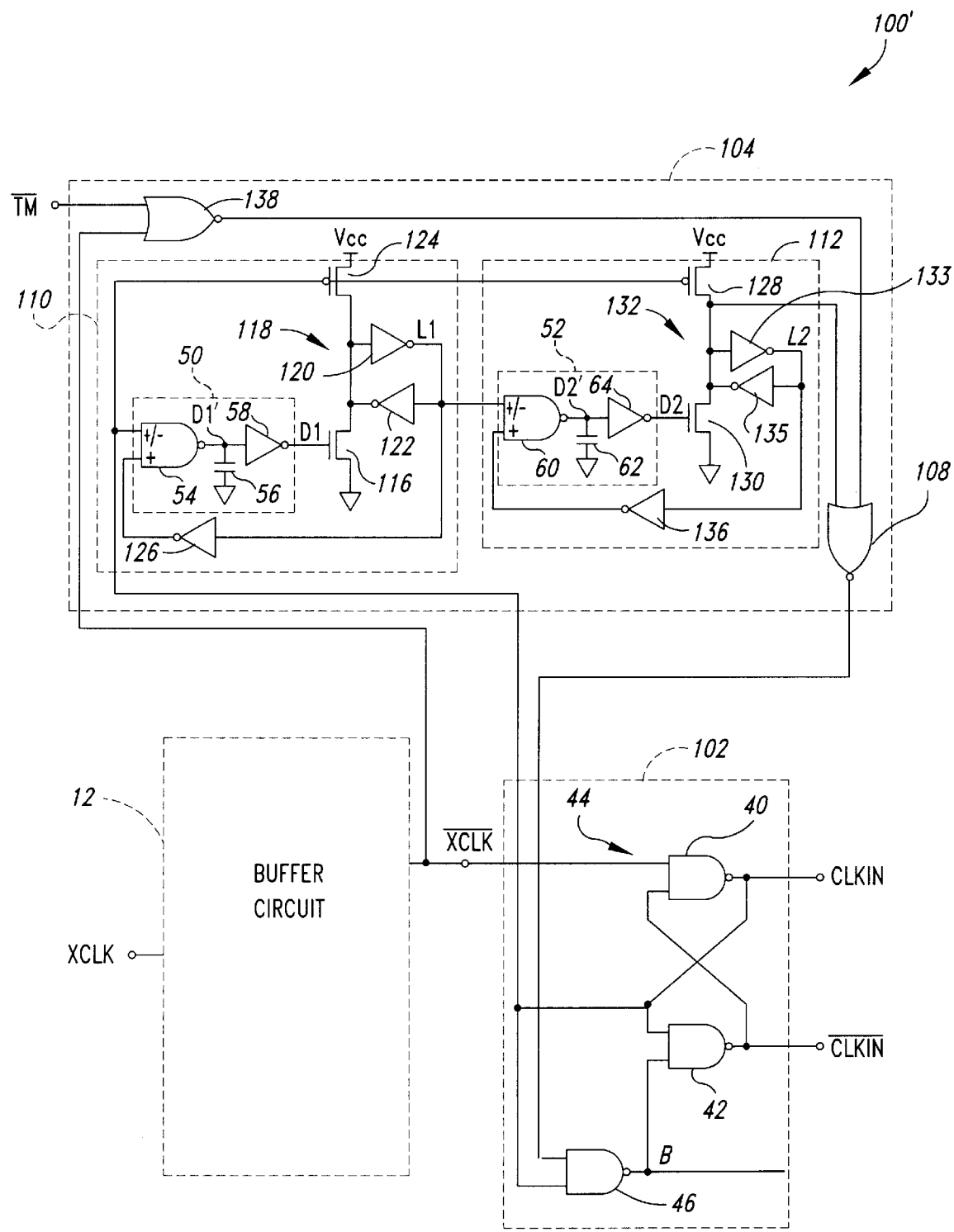
FIG. 4 is a schematic of a clock buffer circuit including a one-shot circuit having a time delay circuit according to one embodiment of the present invention.

FIG. 4 is a schematic of a clock buffer circuit 100 including a one-shot circuit 102 according to one embodiment of the present invention. Components of the clock buffer circuit 100 which are the same as those previously described with reference to FIG. 1 have been given the same reference numbers, and for the sake of brevity will not be described in further detail. The clock buffer circuit 100 is the same as the conventional clock buffer circuit 10 except for a delay circuit 104, which includes two series-connected latching delay circuits 110 and 112. Each latching delay circuit 110 and 112 operates to develop a rising edge on its output a delay time after receiving a rising edge on its input, and to develop a falling edge on its output without such a delay in response to a falling edge on its input, as do the previously described delay circuits 50 and 52. Unlike the prior art delay circuits 50 and 52, however, the latching delay circuits 110 and 112 precharge in response to a rising edge on their outputs, and while precharging maintain their outputs high. In contrast, the delay circuits 50 and 52 must wait for a falling edge on their inputs before precharging. The structure and operation of the latching delay circuits 110 and 112 will be discussed in more detail below.

The delay circuit 104 further includes a NOR gate 108 receiving the output of the latching delay circuit 112 and a test signal from a NOR gate 138. The NOR gate 138 has inputs coupled to receive a test mode signal $\overline{TM}$ and the inverted clock signal $\overline{XCLK}$. In test mode operation, the test mode signal $\overline{TM}$ goes low to enable the NOR gate 138 so that it couples the inverted clock signal $\overline{XCLK}$ to the NOR gate 108. During normal operation of the clock buffer circuit 100, the test mode signal $\overline{TM}$ is high, causing the NOR gate 138 to enable the NOR gate 108. In the following description of the clock buffer circuit 100, the test mode signal $\overline{TM}$ is assumed to be high.

The latching delay circuit 110 includes the positive-edge delay circuit 50 previously described with reference to FIG. 2. One input of the NAND gate 54 (FIG. 2) in the positive-edge delay circuit 50 receives the signal CLKIN, and the output D1 of the delay circuit 50 controls a transistor 116. The transistor 116 is coupled between ground and an input of a latch circuit 118 formed by a pair of cross-coupled inverters 120 and 122. The latch circuit 118 latches its input to the logic level of an input signal and its output L1 at the complementary logic level. A transistor 124 has its gate receiving the signal CLKIN, and its source and drain coupled between the input of the latch circuit 118 and the supply voltage $V_{CC}$. When activated, the transistor 124 couples the input of the latch circuit 118 to the supply voltage $V_{CC}$. The output L1 of the latch circuit 118 is coupled through an inverter 126 to the second input of the NAND gate 54 in the positive-edge delay circuit 50, thereby providing feedback from the output L1 to the NAND gate 54. This feedback is used in precharging the positive-edge delay circuit 50, as will be described in more detail below.

Figure 2:
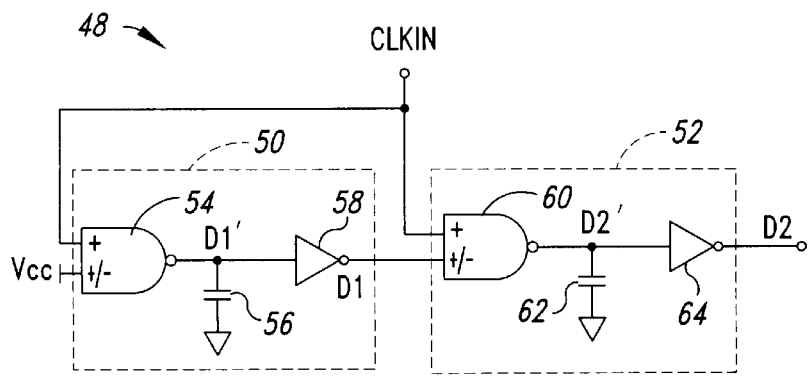
FIG. 2 is a more detailed schematic of two series-connected positive-edge delay circuits forming the conventional time delay circuit of FIG. 1.

The latching delay circuit 112 includes transistors 128 and 130, a latch circuit 132 comprising cross-coupled inverters 133 and 135, an inverter 136, and the positive-edge delay circuit 52 of FIG. 2. All of these components are interconnected and operate identical to their corresponding components in the latching delay circuit 110.

Figure 5:
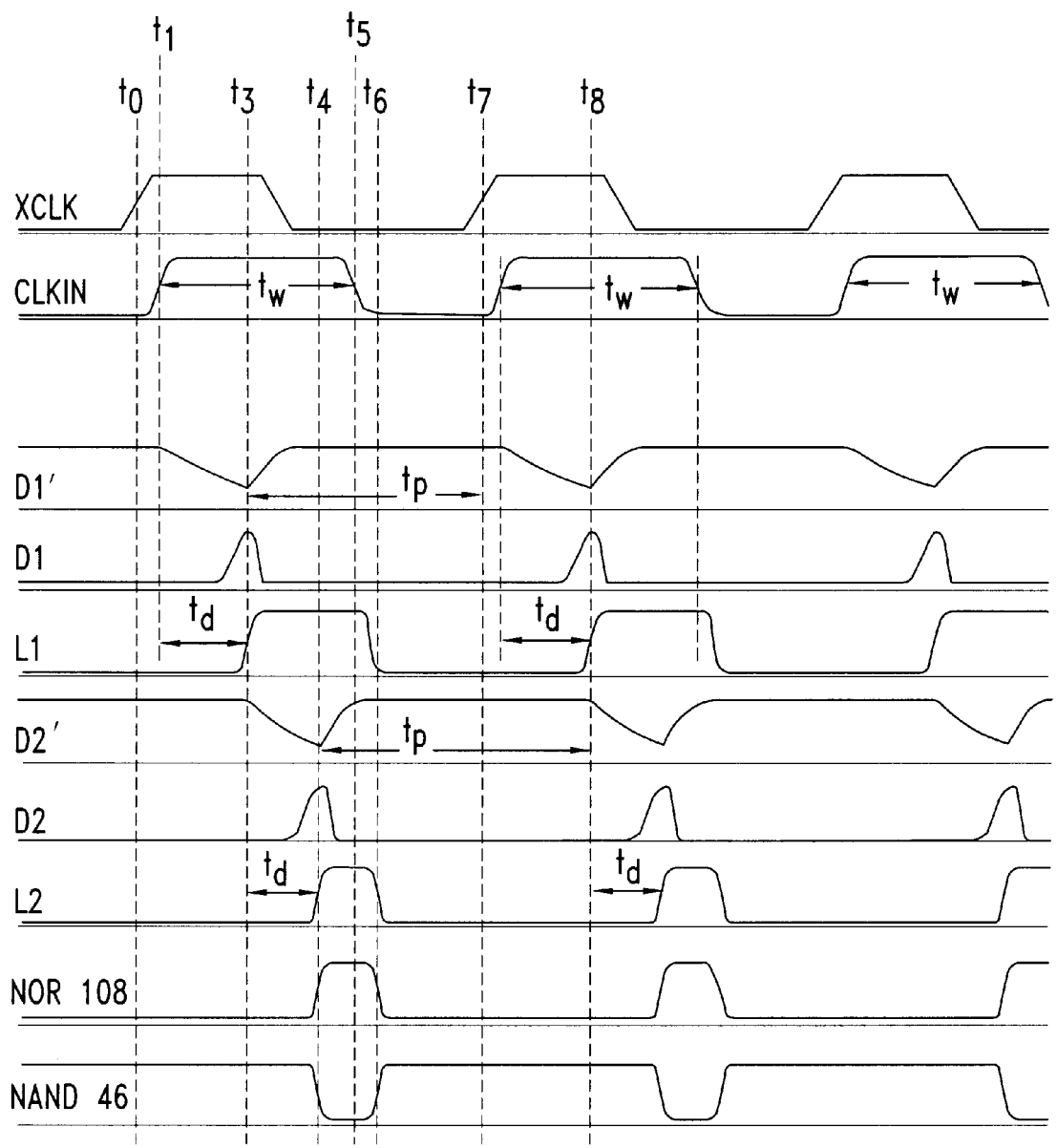
FIG. 5 is a timing diagram illustrating various signals during operation of the clock buffer circuit of FIG. 4.

The operation of the latching delay circuits 110 and 112 will now be described in more detail with reference to FIG. 5 while describing the overall operation of the clock buffer circuit 100. When the signal CLKIN is low, prior to $t_0$, the positive-edge delay circuit 50 drives the output D1 low, turning OFF the transistor 116. The low signal CLKIN also turns ON the transistor 124, coupling the input of the latch circuit 118 high to the supply voltage $V_{CC}$. The latch circuit 118, in turn, latches its input high and its output L1 low. At this point, the inverter 126 provides a high output to the associated input of the positive-edge delay circuit 50.

When the signal CLKIN goes high at time $t_1$ responsive to XCLK going high at $t_0$, the transistor 124 turns OFF, and the positive-edge delay circuit 50 begins timing its time delay $t_d$. The output D1 of the positive-edge delay circuit 50 remains low until after expiration of the delay time $t_d$, at $t_3$, thereby keeping the transistor 116 turned OFF. Note that at this point both the transistor 116 and 124 are turned OFF, isolating the input of the latch circuit 118. The latch circuit 118, however, has latched its input high and output L1 low. After expiration of the delay time $t_d$, at $t_3$, the positive-edge delay circuit 50 drives the output D1 high, turning ON transistor 116 which drives the input of the latch circuit 118 low. In response to the input of the latch circuit 118 going low, the latch circuit 118 drives the output L1 high, also at $t_3$. Thus, the output L1 goes high the delay time $t_d$ after the signal CLKIN goes high at $t_1$.

When the output L1 goes high at $t_3$, the inverter 126 drives its output low, causing the positive-edge delay circuit 50 to begin precharging, and to drive the output D1 low with no delay. In response to the output D1 going low, the transistor 116 turns OFF, isolating the input of the latch circuit 118. At this point, for as long as the signal CLKIN stays high, the latch circuit 118 drives the output L1 high while the positive-edge delay circuit 50 is precharging. In this way, the latch circuit 118 operates to latch the high output D1 provided by the positive-edge delay circuit 50, thus enabling precharging of the positive-edge delay circuit 50 to begin.

The operation of the latching delay circuit 112 is the same as that just described for the latching delay circuit 110 except that it is triggered by L1 going high rather than CLKIN going high. Thus, as shown in FIG. 5, D2 and L2 go high at $t_4$, a delay $t_d$ after L1 goes high at $t_3$. At the time $t_4$, the input to the latch 132 is low, corresponding to the high output L2, which causes the NOR gate 108 to output a high. Since both inputs to the NAND gate 46 are now high, the NAND gate 46 outputs a low to reset the flip-flop 44 and drive CLKIN low at $t_5$. When the signal CLKIN goes low at $t_5$, the transistors 124 and 128 turn ON thereby driving the inputs of the latch circuits 118 and 132, respectively, high. In response to the high input of the latch circuit 132, the NOR gate 108 outputs a low causing the NAND gate 46 to output a high at $t_6$. The latch circuit 118 then resets by latching its input high and output L1 low at $t_6$.

As seen from the timing diagram, in the clock buffer circuit 100 the pulse width $t_w$ of the internal clock signal CLKIN is constant from cycle to cycle. This is understood by examining the delay times $t_d$ of the latching delay circuits 110 and 112. As before, the delay time $t_d$ for each of the latching delay circuits 110 and 112 is defined as the time from when a rising edge is received on its input to the time when its output goes high. For both the latching delay circuits 110 and 112, the delay time $t_d$ is constant and does not vary among cycles of the external clock signal XCLK. The reason the delay time $t_d$ is constant is that during each cycle the internal nodes D1' and D2' of the positive-edge delay circuits 50 and 52, respectively, are precharged to approximately the supply voltage $V_{CC}$. Thus, each cycle the respective internal capacitors are discharged starting from the same voltage so the time it takes for the voltage on each internal node to reach the low threshold value of the associated inverter is constant and does not vary as with the use of the positive-edge delay circuits 50 and 52 in the prior art delay circuit 48 of FIG. 1.

Figure 3:
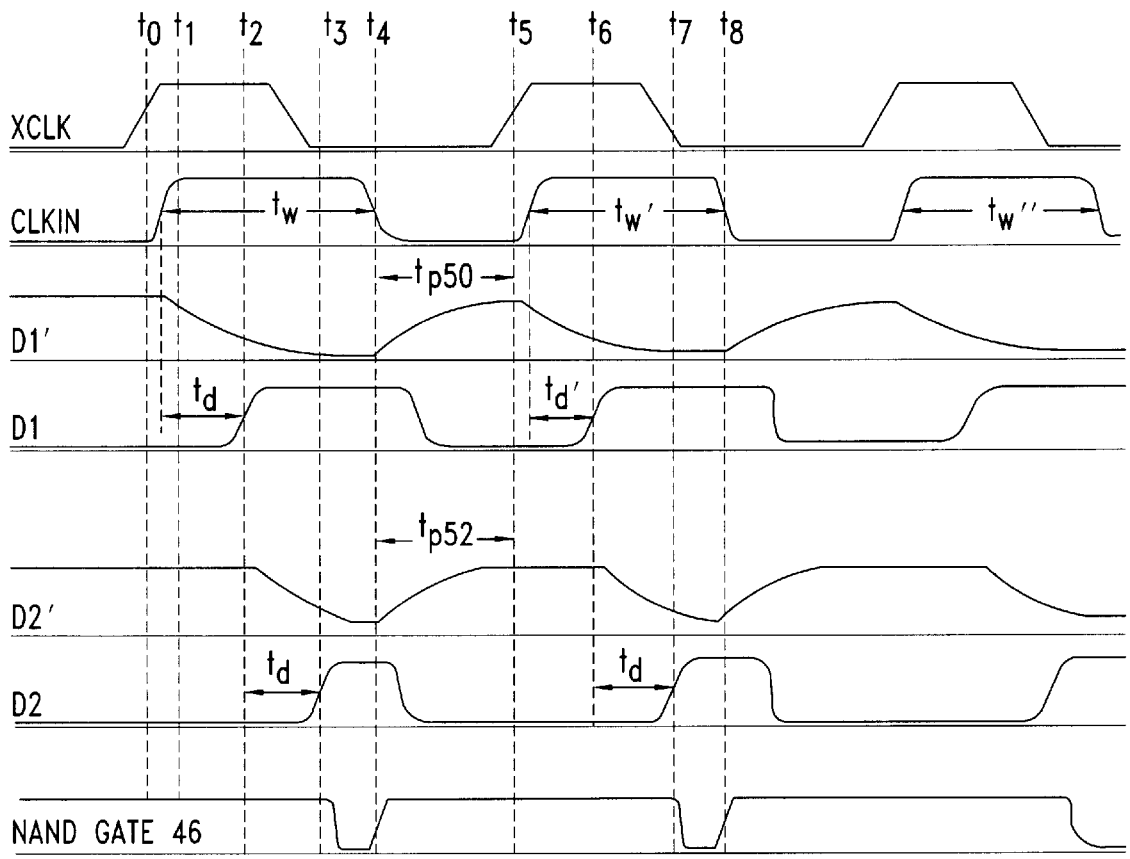
FIG. 3 is a timing diagram of various signals during operation of the clock buffer circuit of FIG. 1.

With the delay circuit 104, the internal nodes D1' and D2' may be precharged each cycle of the external clock signal XCLK because the precharge time $t_p$ is significantly longer than in the prior art delay circuit 48. As seen in the timing diagram of FIG. 5, the positive-edge delay circuit 50 has from just after the time $t_3$ until a time $t_7$ to precharge its internal node D1', while the positive-edge delay circuit 52 has from just after the time $t_4$ until a time $t_8$ to precharge its internal node D2'. In addition, the precharging of the nodes D1' and D2' to their desired maximum levels is possible because the voltages on these nodes are not allowed to decay as low as in the prior art circuit 48, and thus the precharge time $t_p$ need not be as long in order to precharge the internal nodes D1' and D2' to their desired maximum levels. For example, referring back to FIG. 3 it is seen that at the time $t_4$, which is when both nodes start precharging, the internal node D1' has a voltage near ground which means the precharge time required to precharge that node to the supply voltage $V_{CC}$ is relatively long. In contrast, in FIG. 5 the voltage on the internal node D1' just after the time $t_3$, which is when the node D1' starts precharging, is not as close to ground as in the prior art circuit of FIG. 3. Thus, not only is the precharge time $t_p$ of each circuit 50 and 52 longer for the delay circuit 104, but the time needed to precharge each of the internal nodes D1' and D2' is shorter.

Figure 6:
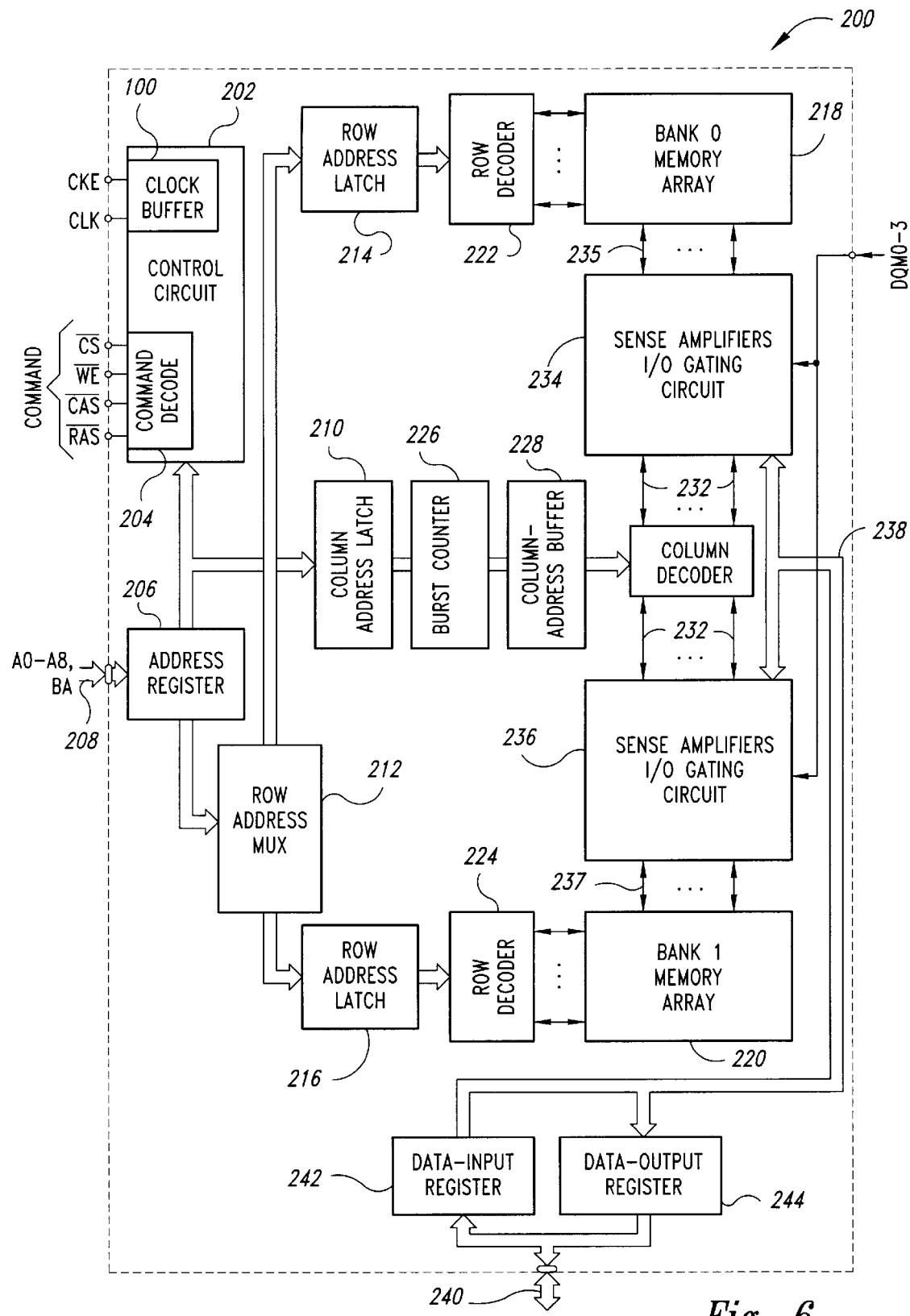
FIG. 6 is a block diagram of a synchronous dynamic random access memory including the clock buffer circuit of FIG. 4.

FIG. 6 is a block diagram of a synchronous dynamic random access memory ("SDRAM") 200 having a control circuit 202 including the clock buffer circuit 100 of FIG. 4. The clock buffer circuit 100 receives an external clock signal CLK corresponding to the signal XCLK and a clock enable signal CKE on respective terminals of the SDRAM 200, and operates as previously described to develop internal clock signals utilized by the control circuit 202 in controlling operation of the SDRAM 200. In the SDRAM 200, all operations are referenced to a particular edge of the external clock signal CLK, typically the rising edge, as known in the art. The control circuit 202 further includes a command decode circuit 204 receiving a number of command signals on respective external terminals of the SDRAM 200. These command signals typically include a chip select signal $\overline{CS}$, write enable signal $\overline{WE}$, column address strobe signal $\overline{CAS}$, and row address strobe signal $\overline{RAS}$. Specific combinations of these signals define particular data transfer commands of the SDRAM 200 such as ACTIVE, PRECHARGE, READ, and WRITE as known in the art. An external circuit, such as a processor or memory controller, generates these data transfer commands in reading data from and writing data to the SDRAM 200.

The SDRAM 200 further includes an address register 206 operable to latch an address applied on an address bus 208, and output the latched address to the control circuit 202, a column address latch 210, and a row address multiplexer 212. During operation of the SDRAM 200, a bank address BA, row address, and column address are sequentially latched by the address register 206 under control of the control circuit 202. In response to the latched bank address BA and row address, the control circuit 202 controls the row address multiplexer 212 to latch and output the row address to one of a row address latch 214 and 216. The row address latches 214 and 216, when activated, latch the row address from the row address multiplexer 212 and output this latched row address to an associated row decoder circuit 222 and 224, respectively. The row decoder circuits 222 and 224 decode the latched row address and activate a corresponding row of memory cells in memory banks 218 and 220, respectively. The memory banks 218 and 220 each include a number of memory cells (not shown) arranged in rows and columns, each memory cell operable to store a bit of data and having an associated row and column address.

When a column address is applied on the address bus 208, the column address is latched by the address register 206 under control of the control circuit 202, and output to a column address latch 210, which latches the column address and in turn outputs the column address to a burst counter circuit 226. The burst counter circuit 226 operates to develop sequential column addresses beginning with the latched column address when the SDRAM 200 is operating in a burst mode. The burst counter 226 outputs the developed column addresses to a column address buffer 228, which in turn outputs the developed column address to a column decoder circuit 230. The column decoder circuit 230 decodes the column address and activates one of a plurality of column select signals 232 corresponding to the decoded column address. The column select signals 232 are output to sense amplifier and I/O gating circuits 234 and 236 associated with the memory banks 218 and 220, respectively. The sense amplifier and I/O gating circuits 234 and 236 sense and store the data placed on the digit lines 235 and 237, respectively, by the memory cells in the addressed row and to thereafter couple the digit lines 235 or 237 corresponding to the addressed memory cell to an internal data bus 238. The internal data bus 238 is coupled to a data bus 240 of the SDRAM 200 through either a data input register 242 or a data output register 244. A data mask signal DQM controls the circuits 234 and 236 to avoid data contention on the data bus 240 when, for example, a READ command is followed immediately by a WRITE command, as known in the art.

In operation, during a read data transfer operation, an external circuit, such as a processor, applies a bank address BA and row address on the address bus 208 and provides an ACTIVE command to the command decode circuit 204. This applied address and command information is latched by the SDRAM 200 on the next rising edge of the external clock signal CLK, and the control circuit 202 thereafter activates the addressed memory bank 218 or 220. The supplied row address is coupled through the row address multiplexer 212 to the row address latch 214 or 216 associated with the addressed bank, and this row address is thereafter decoded and the row of memory cells in the activated memory bank 218 or 220 is activated. The sense amplifiers in the sense amplifier and I/O gating circuit 234 or 236 sense and store the data contained in each memory cell in the activated row of the addressed memory bank 218 or 220.

The external circuit thereafter applies a READ command to the command decode circuit 204 including a column address on the address bus 208, both of which are latched on the next positive-edge of the external clock signal CLK. The latched column address is then routed through the circuits 210, 226, and 228 to the column decoder circuit 230 under control of the control circuit 204. The column decoder 230 decodes the latched column address and activates the column select signal 232 corresponding to that decoded column address. In response to the activated column select signal 232, the sense amplifier and I/O gating circuit 234 or 236 transfers the addressed data onto the internal data bus 238, and the data is then transferred from the internal data bus 238 through the data output register 244 and onto the data bus 240 where it is read by the external circuit.

During a write data transfer operation, after activating the addressed memory bank 218 or 220 and the addressed row within that bank, the external circuit applies a WRITE command to the command decode circuit 204 including a column address on the address bus 208 and data on the data bus 240. The WRITE command, column address, and data are latched respectively into the command decode circuit 204, address register 206, and data input register 242 on the next positive-edge of the external clock signal CLK. The data latched in the data input register 242 is placed on the internal data bus 238, and the latched column address is routed through the circuits 210, 226, and 228 to the column decoder circuit 230 under control of the control circuit 204. The column decoder 230 decodes the latched column address and activates the column select signal 232 corresponding to that decoded address. In response to the activated column select signal 232, the data on the internal data bus 238 is transferred through the sense amplifier and I/O gating circuit 234 or 236 to the digit lines 235 or 237 corresponding to the addressed memory cell. The row containing the addressed memory cell is thereafter deactivated to store the written data in the addressed memory cell.

Figure 7:
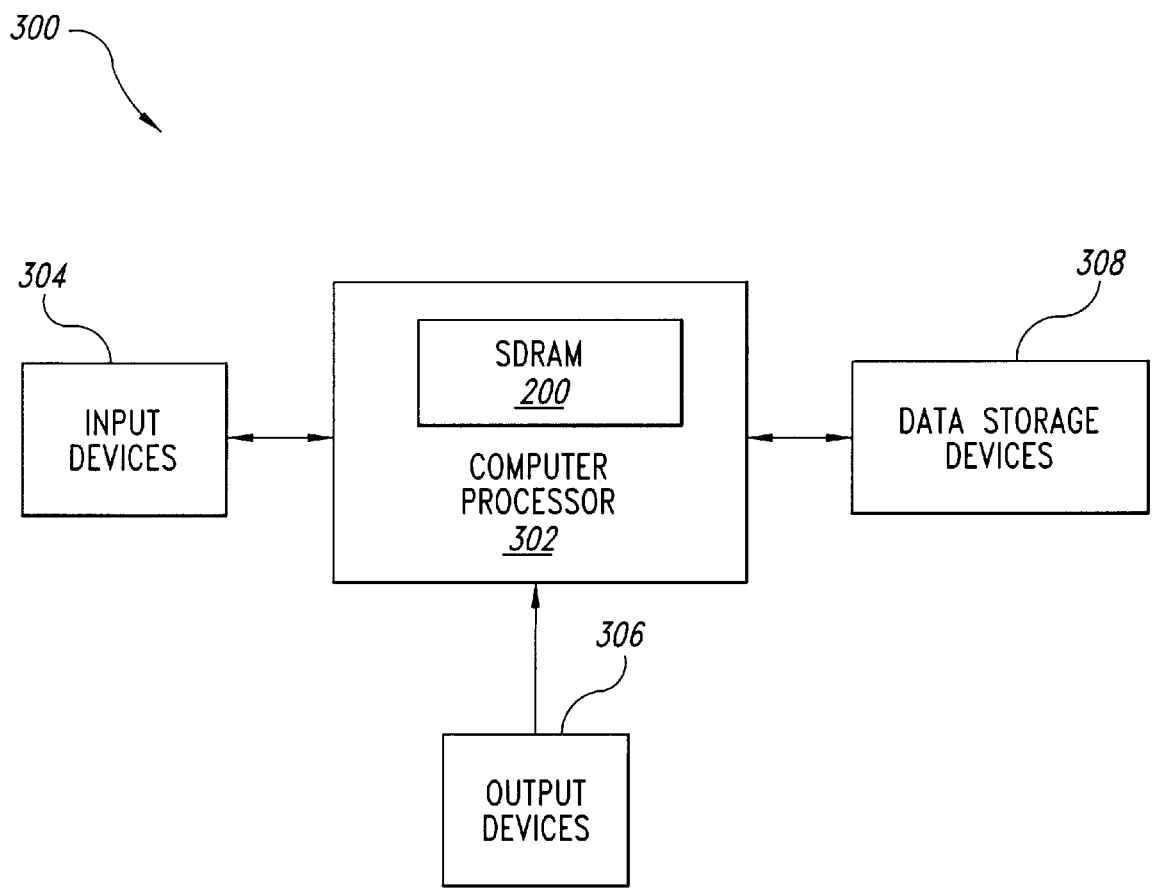
FIG. 7 is a block diagram of a computer system including the synchronous dynamic random access memory of FIG. 6.

FIG. 7 is a block diagram of a computer system 300 including the SDRAM 200 of FIG. 6. The computer system 300 includes a processor 302 for performing various computing functions, such as executing specific software to perform specific calculations or tasks. In addition, the computer system 300 includes one or more input devices 304, such as a keyboard or a mouse, coupled to the processor 302 to allow an operator to interface with the computer system 300. Typically, the computer system 300 also includes one or more output devices 306 coupled to the processor 302, such output devices typically being a printer or a video terminal. One or more data storage devices 308 are also typically coupled to the processor 302 to store data or retrieve data from external storage media (not shown). Examples of typical data storage devices 308 include hard and floppy disks, tape cassettes, and compact disk read-only memories (CD-ROMs). The processor 302 is typically coupled to the SDRAM 200 through a control bus, a data bus, and an address bus to provide for writing data to and reading data from the SDRAM, and a clocking circuit (not shown) typically develops a clock signal driving the processor 302 and SDRAM 200 during such data transfers.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

I claim:

1. A one-shot circuit, comprising:

a pulse generation circuit having an external clock terminal adapted to receive an external clock signal, a reset terminal coupled to receive a reset signal, and an internal clock terminal on which the pulse generation circuit develops an internal clock signal, the pulse generation circuit driving the internal clock signal active in response to the external clock signal going active, and driving the internal clock signal inactive in response to the reset signal going active;

a first latching delay circuit having an output terminal, and having an input terminal coupled to the internal clock terminal of the pulse generation circuit, the first latching delay circuit driving a first delay signal on its output terminal active a first delay time after the internal clock signal goes active, and precharging in response to the first delay signal going active; and a second latching delay circuit having an output terminal coupled to the reset terminal, and an input terminal coupled to the output terminal of the first latching delay circuit, the second latching delay circuit driving the reset signal on its output terminal active a second delay time after the first delay signal goes active, and precharging in response to the reset signal going active.

2. The one-shot circuit of claim 1 wherein the first and second delay times are equal.

3. The one-shot circuit of claim 1 wherein the first latching delay circuit precharges from when the first delay signal goes active until the internal clock signal again goes active after having gone inactive.

4. The one-shot circuit of claim 1 wherein the second latching delay circuit precharges from when the second delay signal goes active until the first delay signal again goes active after having gone inactive.

5. The one-shot circuit of claim 1, further including a number of additional latching delay circuits coupled in series between the output terminal of the second latching delay circuit and the reset terminal, each additional latching delay circuit having an associated delay time, and each latching delay circuit precharging for at least the summation of all other delay times associated with all other delay circuits.

6. The one-shot circuit of claim 1 wherein the pulse generation circuit is a reset/set(RS) flip-flop having a set input coupled to the external clock terminal and a reset input coupled to the reset terminal.

7. The one-shot circuit of claim 1 wherein each latching delay circuit comprises:
   a positive-edge delay circuit having trigger and reset inputs, and an output;
   a latch circuit having an input and an output, the latch circuit latching its input to the logic level of a signal applied on the input and latching its output at the complementary logic level;
   a first switch circuit having signal terminals coupled between the input of the latch circuit and a reference voltage, and a control terminal coupled to the output of the positive-edge delay circuit;
   a second switch circuit having signal terminals coupled between the input of the latch circuit and a supply voltage, and a control terminal coupled to the internal clock terminal of the pulse generation circuit; and
   an inverter circuit having an input coupled to the output of the latch circuit, and an output coupled to the reset input of the positive-edge delay circuit.

8. The one-shot circuit of claim 7 wherein the positive-edge delay circuit comprises:
   a NAND gate having two inputs and an output;
   a capacitor coupled between the output of the NAND gate and the reference voltage; and
   an inverter having an output coupled to the output of the positive-edge delay circuit, and having an input coupled to the output of the NAND gate.

9. A one-shot circuit, comprising:
   a pulse generation circuit having an external clock terminal adapted to receive an external clock signal, a reset terminal coupled to receive a reset signal, and an internal clock terminal on which the pulse generation circuit develops an internal clock signal, the pulse generation circuit operable in a first mode to drive the internal clock signal from a first level to a second level in response to a transition of the external clock signal from a first level to a second level, and operable in a second mode to drive the internal clock signal from the second level to the first level in response to the reset signal going active; and
   a delay circuit having input and output terminals coupled to the internal clock terminal and reset terminal, respectively, of the pulse generation circuit, the delay circuit operable to drive the reset signal active a delay time after the pulse generation circuit drives the internal clock signal from the first level to the second level, and the delay circuit further operable, while maintaining the reset signal active, to precharge in response to the reset signal going active.

10. The one-shot circuit of claim 9 wherein once the pulse generation circuit drives the internal clock signal from the second level to the first level in response to the reset signal going active, the delay circuit drives the reset signal inactive before the next transition of the external clock signal from the first level to the second level.

11. The one-shot circuit of claim 9 wherein the delay circuit comprises:
   a first positive-edge delay circuit having first and second input terminals coupled to receive first and second input signals, respectively, and an output terminal and operable to develop a positive-edge transition on the output terminal after positive-edge transitions of both the first and second input signals, the positive-edge transition on the output terminal being developed a delay time after the positive-edge transition of the first and second input signals, and to develop a negative-edge transition on the output terminal having no such delay time in response to a negative-edge transition of one of the first and second input signals;
   a first latch circuit having an input and an output terminal, the first latch circuit operable to store the level of a signal applied on the input terminal and provide the complement of the stored level on the output terminal;
   a first switch circuit having signal terminals coupled between the input terminal of the latch circuit and a reference voltage, and a control terminal coupled to the output terminal of the first positive-edge delay circuit;
   a second switch circuit having signal terminals coupled between the input terminal of the first latch circuit and a supply voltage, and a control terminal coupled to the internal clock terminal of the pulse generation circuit;
   a first inverter circuit having an input terminal coupled to the output terminal of the first latch circuit, and an output terminal coupled to the second input terminal of the first positive-edge delay circuit.

12. The one-shot circuit of claim 11 wherein the first and second switch circuits are transistors.

13. The one-shot circuit of claim 9, further including a plurality of delay circuits connected in series between the internal clock terminal and the reset terminal, the combined time delay of the plurality of delay circuits having a predetermined value that is equal to the summation of the delay times of the delay circuits connected in series.

14. The one-shot circuit of claim 9 wherein the pulse generation circuit comprises:
   first and second cross-coupled NAND gates coupled to form a reset/set(RS) flip-flop, the output of the first NAND gate coupled to the internal clock terminal, the output of the second NAND gate coupled to a complementary internal clock terminal, an input of the first NAND gate operable as a set input and coupled to the external clock terminal, and one input of the second NAND gate operable as a reset input; and
   a NAND gate having an output terminal coupled to the reset input of the second NAND gate of the RS flip-flop, a first input terminal coupled to the internal clock terminal, and a second input terminal coupled to the reset terminal.

15. A clock generation circuit, comprising:
   a buffer circuit having an input terminal adapted to receive an external clock signal and an output terminal, the buffer circuit operable to develop a buffered external clock signal on the output terminal;
   a one-shot circuit including,
      a pulse generation circuit having an external clock terminal adapted to receive the buffered external clock signal, a reset terminal coupled to receive a reset signal, and an internal clock terminal on which the pulse generation circuit develops an internal clock signal, the pulse generation circuit driving the internal clock signal active in response to the external clock signal going active, and driving the internal clock signal inactive in response to the reset signal going active; and
      a first latching delay circuit having an output terminal, and having an input terminal coupled to the internal clock terminal of the pulse generation circuit, the first latching delay circuit driving a first delay signal on its output terminal active a first delay time after the internal clock signal goes active, and precharging in response to the first delay signal going active; and a second latching delay circuit having an output terminal coupled to the reset terminal, and an input terminal coupled to the output terminal of the first latching delay circuit, the second latching delay circuit driving the reset signal on its output terminal active a second delay time after the internal clock signal goes active, and precharging in response to the reset signal going active.

16. The clock generation circuit of claim 15 wherein each latching delay circuit comprises:

a positive-edge delay circuit having trigger and reset inputs, and an output;

a latch circuit having an input and an output, the latch circuit latching its input to the logic level of a signal applied on the input and latching its output at the complementary logic level;

a first switch circuit having signal terminals coupled between the input of the latch circuit and a reference voltage, and a control terminal coupled to the output of the positive-edge delay circuit;

a second switch circuit having signal terminals coupled between the input of the latch circuit and a supply voltage, and a control terminal coupled to the internal clock terminal of the pulse generation circuit; and an inverter circuit having an input coupled to the output of the latch circuit, and an output coupled to the reset input of the positive-edge delay circuit.

17. The clock generation circuit of claim 16 wherein the first and second switch circuits are transistors.

18. The clock generation circuit of claim 15 wherein the pulse generation circuit comprises:

first and second cross-coupled NAND gates coupled to form a reset/set(RS) flip-flop, the output of the first NAND gate coupled to the internal clock terminal, the output of the second NAND gate coupled to a complementary internal clock terminal, an input of the first NAND gate operable as a set input and coupled to the buffered external clock terminal, and one input of the second NAND gate operable as a reset input; and a NAND gate having an output terminal coupled to the reset input of the second NAND gate of the RS flip-flop, and a first input terminal coupled to the internal clock terminal, and a second input terminal coupled to the reset terminal.

19. A synchronous memory device, comprising:

an address bus;

a control bus;

a data bus;

an address decoder coupled to the address bus;

a read/write circuit coupled to the data bus;

a memory-cell array coupled to the address decoder, control circuit, and read/write circuit; and a control circuit coupled the control bus and operable to control operation of the address decoder, read/write circuit, and memory-cell array in response to an internal clock signal, the control circuit including a one-shot circuit having, a pulse generation circuit having an external clock terminal adapted to receive an external clock signal, a reset terminal coupled to receive a reset signal, and an internal clock terminal on which the pulse generation circuit develops an internal clock signal, the pulse generation circuit driving the internal clock signal active in response to the external clock signal going active, and driving the internal clock signal inactive in response to the reset signal going active, a first latching delay circuit having an output terminal, and having an input terminal coupled to the internal clock terminal of the pulse generation circuit, the first latching delay circuit driving a first delay signal on its output terminal active a first delay time after the internal clock signal goes active, and precharging in response to the first delay signal going active, and a second latching delay circuit having an output terminal coupled to the reset terminal, and an input terminal coupled to the output terminal of the first latching delay circuit, the second latching delay circuit driving the reset signal on its output terminal active a second delay time after the first delay signal goes active, and precharging in response to the reset signal going active.

20. The synchronous memory device of claim 19 wherein the synchronous memory device is a synchronous dynamic random access memory.

21. A computer system, comprising:

a data input device;

a data output device; and a processor coupled to the data input and output devices, the processor including a synchronous memory device that includes a clock buffer circuit having, a pulse generation circuit having an external clock terminal adapted to receive an external clock signal, a reset terminal coupled to receive a reset signal, and an internal clock terminal on which the pulse generation circuit develops an internal clock signal, the pulse generation circuit driving the internal clock signal active in response to the external clock signal going active, and driving the internal clock signal inactive in response to the reset signal going active, and a first latching delay circuit having an output terminal, and having an input terminal coupled to the internal clock terminal of the pulse generation circuit, the first latching delay circuit driving a first delay signal on its output terminal active a first delay time after the internal clock signal goes active, and precharging in response to the first delay signal going active, and a second latching delay circuit having an output terminal coupled to the reset terminal, and an input terminal coupled to the output terminal of the first latching delay circuit, the second latching delay circuit driving the reset signal on its output terminal active a second delay time after the first delay signal goes active, and precharging in response to the reset signal going active.

22. A method for generating an internal clock signal in response to an external clock signal, the method comprising the steps of:

detecting a transition of the external clock signal from a first logic level to a second logic level;

driving the internal clock signal to a first logic level in response to the detected transition of the external clock signal;

timing a first delay time in response to driving the internal clock signal to the first logic level;

precharging a first time delay circuit for timing the first delay time, the precharging starting upon expiration of the first delay time;

timing a second time delay upon expiration of the first delay time;

driving the internal clock signal to a second logic level in response to the expiration of the second delay time; and precharging a second time delay circuit for timing the second delay time, a next transition of the internal clock signal from the first logic level to the second logic level occurring a predetermined time after expiration of the second delay time, and precharging the first time delay circuit lasting from the expiration of the first delay time until the predetermined time.

23. The method of claim 22, further including the step of developing a complementary internal clock signal simultaneous with developing the internal clock signal.

24. The method of claim 22 wherein the external clock signal transitions from the second logic level to the first logic level before expiration of the second delay time.

25. A method for generating an internal clock signal in a synchronous memory, the synchronous memory adapted to receive an external clock signal, the method comprising the steps of:

detecting a transition of the external clock signal from a first logic level to a second logic level;

driving the internal clock signal to a first logic level in response to the detected transition of the external clock signal;

timing a first delay time in response to driving the internal clock signal to the first logic level;

precharging a first time delay circuit for timing the first delay time, the precharging starting upon expiration of the first delay time;

timing a second time delay upon expiration of the first delay time;

driving the internal clock signal to a second logic level in response to the expiration of the second delay time; and precharging a second time delay circuit for timing the second delay time, a next transition of the internal clock signal from the first logic level to the second logic level occurring a predetermined time after expiration of the second delay time, and precharging the first time delay circuit lasting from the expiration of the first delay time until the predetermined time.

26. The method of claim 25, further including the step of developing a complementary internal clock signal simultaneous with developing the internal clock signal.

27. A method for developing an internal clock signal in response to an external clock signal, the method comprising the steps of:

detecting a transition of the external clock signal from a first logic level to a second logic level;

driving the internal clock signal to a first logic level in response to the detected transition of the external clock signal;

discharging a first node to thereby decrease a voltage on the first node, the discharging beginning when the internal clock signal is driven to the first logic level;

discharging a second node to thereby decrease a voltage on the second node, the discharging beginning when the voltage on the first node has reached a first threshold value;

precharging the first node to thereby increase the voltage on the first node, the precharging beginning when the voltage on the first node has reached the first threshold value;

driving the internal clock signal to a second logic level when the voltage on the second node has reached a second threshold value; and precharging the second node to thereby increase the voltage on the second node, the precharging beginning when the voltage on the second node has reached the second threshold value.

28. The method of claim 30 wherein the step of precharging the first node lasts at least until the voltage on the second node has reached the second threshold value.

29. The method of claim 27 wherein the step of precharging the second node lasts at least until the voltage on the first node has reached the first threshold value.

30. The method of claim 27 wherein during the steps of discharging the voltages on the respective first and second nodes decay exponentially according to the characteristics of a resistor-capacitor (RC) circuit.

\* \* \* \* \*